United States Patent [19]

Nyswander et al.

[11] 4,119,917
[45] Oct. 10, 1978

[54] SEQUENTIALLY TRIGGERING TWO OR MORE HYDROGEN THYRATRONS WITH PRECISION TIMING

[76] Inventors: Reuben E. Nyswander, 608 A Nimitz Ave., China Lake; Cass R. Roquemore, 239 Peg, Ridgecrest, both of Calif. 93555

[21] Appl. No.: 848,188

[22] Filed: Nov. 3, 1977

Related U.S. Application Data

[63] Continuation of Ser. No. 304,575, Nov. 2, 1972, abandoned.

[51] Int. Cl.² .......................... H03K 4/00; H03K 5/15
[52] U.S. Cl. ........................................ 328/67; 328/185
[58] Field of Search ............................... 328/67, 185

[56] References Cited

U.S. PATENT DOCUMENTS

| 2,605,449 | 7/1952 | Schrader | 328/67 X |
|---|---|---|---|
| 2,807,722 | 9/1957 | Roeschke | 328/63 X |
| 2,891,155 | 6/1959 | Carr et al. | 328/67 |
| 3,100,872 | 8/1963 | Hickey et al. | 328/67 |
| 3,119,968 | 1/1964 | Schonberg | 328/67 |
| 3,212,011 | 10/1965 | Clark et al. | 328/67 |

*Primary Examiner*—Malcolm F. Hubler
*Attorney, Agent, or Firm*—R. S. Sciascia; Roy Miller; W. Thom Skeer

[57] ABSTRACT

Two or more hydrogen thyratrons sequentially triggered with precision timing. The first tube is triggered and provides a long, low power, slowly rising pulse to a load. Approximately midway in said pulse the second tube is made to conduct, providing a short, high power pulse to the load. The second tube is triggered at a predetermined time delay after the first tube in response to the positive swing of the LC resonant circuit output.

9 Claims, 1 Drawing Figure

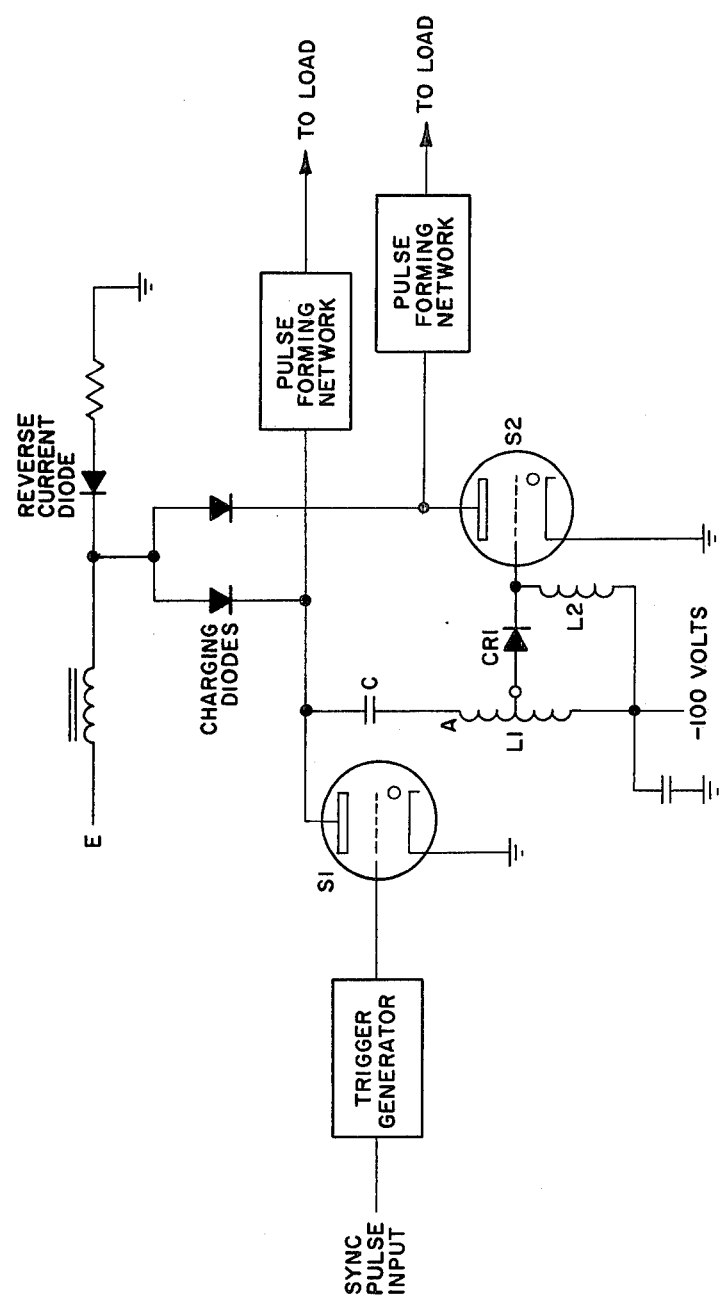

SEQUENTIALLY TRIGGERING TWO OR MORE HYDROGEN THYRATRONS WITH PRECISION TIMING

This is a continuation, of application Ser. No. 304,575, filed Nov. 2, 1972, now abandoned.

BACKGROUND OF THE INVENTION

In certain applications it is necessary to trigger hydrogen thyratron switches in sequence with a precise time delay separating the conduction of one tube from the conduction of the next tube. An example of such an application is a circuit for operating a magnetron with a very short pulse duratin, which example is the invention disclosed and claimed by the same inventor in U.S. Pat. 4,051,439 entitled "Short Pulse Magnetron Transmitter" issued on Sept. 27, 1977 application.

In operation, the magnetron oscillates. To achieve proper initiation the pulse applied to the magnetron by the modulator in the circuit must have a relatively slow rate of rise in the transition region, i.e., the region which the magnetron begins to oscillate. If the applied pulse rises too rapidly in the critical region either of two types of misfire may occur. In the first type the tube goes into oscillation in the wrong mode, i.e., at the wrong frequency and at a higher voltage. In the second, the tube may not oscillate at all for 50 or 60 nanoseconds, a critical deficiency when applied to some applications. Both of the above misfires may be accompanied by a high voltage arc over inside the tube.

In the invention disclosed in the referenced patent application two hydrogen thyratrons are utilized as switch tubes in line-type modulators. The first tube is triggered in the conventional manner and causes a relatively long pulse, e.g., 100 nanoseconds, to be applied to the magnetron. The pulse rate-of-rise is slow enough that the magnetron can, without difficulty, start to oscillate in the proper mode. The pulse amplitude is such that the magnetron oscillates at a very low power level. At approximately the center of the long, low power pulse, the second thyratron is made to start conduction. This causes a short, e.g., 11 nanosecond, high power pulse to be applied to the magnetron. Since the magnetron is already oscillating normally in the proper mode, there are no turn-on problems and the magnetron output goes to full power level for the duration of the short pulse.

Although the present invention was first conceived to be utilized in a magnetron transmitter circuit, its utility is not restricted to that application. The present invention can, in fact, be utilized in any application in which it is desired to sequentially trigger two or more thyratrons. That is, in certain applications it is necessary to trigger hydrogen thyratron switches in sequence with a precise time delay separating the conduction of one tube from the conduction of the next tube. The present invention provides the device for doing so in any such application.

BRIEF DESCRIPTION OF THE DRAWING

The FIGURE is a schematic diagram, partially in block form, of the preferred embodiment of the present invention.

DESCRIPTION OF THE PREFERRED EMBODIMENT

The FIGURE shows the circuit of the preferred embodiment of the present invention for sequentially triggering thyratrons $S_1$ and $S_2$ such that thyratron $S_2$ will be triggered in response to, and a predetermined, precise time delay after, $S_1$. If the present invention were compared with the magnetron transmitter of the referenced application in order to perceive their similarities and differences, the synchronizing pulse input, trigger generator, and thyratron $S_1$ of the present invention may be considered equivalent to the syncronizing pulse input, trigger generator, and thyratron $S_1$ of the transmitter. Additionally, the power source of the present invention, including the voltage supply E, the inductance, the reverse current diode, and the charging diodes, can be considered similar to the power supply, inductor $L_1$, and rectifiers $CR_1$, $CR_2$, and $CR_3$ of the transmitter. The novelty of the present invention resides in the circuitry coupling thyratrons $S_1$ and $S_2$, and the use of the circuitry to sequentially trigger the thyratrons.

In the preferred embodiment of the present invention capacitor C is coupled to the anode of thyratron $S_1$. The other terminal of capacitor C is coupled to inductor $L_1$, which together form a resonant circuit. The other end of inductor $L_1$ is coupled to a voltage supply, through a by-pass capacitor to the circuit common ground, and to the first terminal of a second inductor $L_2$. The tap terminal of inductor $L_1$ is coupled through diode $CR_1$ to the grid of thyratron $S_2$. The grid of thyratron $S_2$ is also coupled to the second terminal of inductor $L_2$. The output of each thyratron $S_1$ and $S_2$ is taken at its anode.

The operation of the preferred embodiment is as follows: Thyratron tube $S_1$ may be triggered in the conventional manner by the synchronizing pulse input and trigger generator. Before tube $S_1$ goes into conduction capacitor C is charged to the value of 2E volts. Point A, the junction between capacitor C and inductor $L_1$, will be at $-E$ volts.

When tube $S_1$ conducts the electrical potential on its anode will drop to a value near that of the circuit common ground. As it does the voltage at A decreases to a level of approximately $-2E$. The resultant negative pulse is isolated from the grid of tube $S_2$ by diode $CR_1$.

Capacitor C then discharges through tube $S_1$, the by-pass capacitor, inductor $L_1$, and capacitor C. As the current increases in $L_1$ the voltage at A begins to rise, causing a positive back swing to develop. Since the circuit is a resonant circuit the voltage at A should "ring", or swing negative and then positive in decreasing swings, if permitted to do so. As the voltage at A goes positive the potential on the tap terminal of inductor $L_1$ follows suit. The positive potential on the tap appears on the grid of tube $S_2$. As a result, thyratron $S_2$ is triggered into conduction through diode $CR_1$.

The delay time between the conduction of thyratron $S_1$ and the conduction of thyratron $S_2$ is a function of the values of inductor $L_1$, capacitor C, and the total ionization time of thyratron $S_2$. Practical values of obtainable delay range from less than 100 nanoseconds to several microseconds. A practical value of capacitor C is in the order of 50 picofarads. For short values of delay the positive pulse which triggers tube $S_2$ will have a very rapid rate-of-rise, which is desirable in that the total ionization time of tube $S_2$ is thereby minimized.

The purpose of $L_2$ is to isolate the grid of tube $S_2$ from the negative bias supply. Although it is shown as an inductor it could be any means, such as a resistor, that provides the isolation. And, the purpose of diode $CR_1$ is to prevent the grid of tube $S_2$ from being driven to a large negative voltage when tube $S_1$ goes into conduction. It is preferable that diode $CR_1$ be a fast recovery diode.

The advantages of the present invention are that the delay in time between the tubes is independent of any variations in the ionization time of tube $S_1$. Variations in the ionization time of tube $S_2$ are minimized because of the high voltage, high energy trigger applied to its grid. The high energy, high voltage pulse applied to tube $S_2$, which is higher than any delay generator could produce, reduces the time variation or jitter in the triggering of tube $S_2$. Additionally, when compared with the invention of the referenced application, the external delay circuit and the trigger generator for thyratron $S_2$ are eliminated.

What is claimed is:

1. A precision thyratron triggering circuit comprising:
    A first thyratron having an anode, a cathode, and a grid;
    a second thyratron having an anode, a cathode, and a grid;
    trigger generator means connected to the grid of said first thyratron for causing said first thyratron to become conductive;
    a capacitor connected to the anode of said first thyratron;
    a first output connected to the anode of said first thyratron;
    a tapped inductor connected in series with said capacitor so as to provide a series resonant circuit therewith;
    a source of negative potential connected to said tapped inductor;
    an inductor connected between said source of negative potential and the grid of said second thyratron;
    means connecting the tap of said tapped inductor to the grid of said second thyratron for coupling part of the resonant energy of said series resonant circuit thereto;
    a second output connected to the anode of said second thyratron;
    a common ground connected to the cathodes of said first and second thyratrons; and
    a source of positive electrical potential effectively connected to the anodes of said first and second thyratrons, whereby the triggering of said first thyratron produces a long, slowrising pulse at said first output followed by a short fast rising pulse at said second output in response to the resonant energy coupled to the grid of said second thyratron.

2. A precision thyratron triggering circuit according to claim 1 wherein the means connecting the tap of said tapped inductor to the grid of said second thyratron is a diode.

3. A thyratron circuit comprising;
    a first thyratron having a control grid, a cathode, and anode;
    a second thyratron having a control grid, a cathode, and an anode;
    a common ground connecting the cathodes of said first and second thyratrons;
    a source of operating potential effectively connected to the anodes of said first and second thyratrons;
    a first coupling network connected to the anode of said first thyratron connecting its output to a load;
    a second coupling network connected to the anode of said second thyratron connecting its output to a load;
    triggering means connected to the control grid of said first thyratron;
    a source of negative bias connected to the control grid of said second thyratron;
    a three-terminal, series-resonant, L-C circuit effectively connected for alternating current between the anode and cathode of said first thyratron by the first and second terminals and to the control grid of said second thyratron by the third terminal, said three-terminal, series-resonant, L-C circuit includes a first terminal, a second terminal, a capacitor connected to said first terminal, an inductor connected between said capacitor and said second terminal, a third terminal connected to said inductor, whereby conduction of said first thyratron causes resonant ringing in said three-terminal, L-C circuit which triggers said second thyratron.

4. A thyratron circuit according to claim 3 in which said three-terminal, series-resonant, L-C circuit has a tapped inductor with the tap connection providing the third terminal.

5. A thyratron circuit according to claim 4 wherein said third terminal is connected to said control grid of said second thyratron by a series-connected diode.

6. A thyratron circuit according to claim 5 wherein the control grid of said second thyratron is connected to the aforesaid source of negative bias by an inductor.

7. A thyratron circuit according to claim 5 wherein said series connected diode is of the fast-recovery type.

8. A thyratron circuit according to claim 5 wherein said three-terminal, series-resonant, L-C circuit has a capacitor connected to the anode of said first thyratron via the first terminal thereof and an inductor effectively connected for alternating current to the cathode of said first thyratron by the second terminal thereof.

9. A thyratron circuit according to claim 8 in which the effective connection between the second terminal and the cathode of said first thyratron is made by a capicator.

* * * * *